United States Patent [19]

Yokoyama et al.

[11] Patent Number: 4,742,569
[45] Date of Patent: May 3, 1988

[54] TUNING CIRCUIT FOR AM RECEIVER

[75] Inventors: Hajime Yokoyama; Noboru Takada, both of Saitama; Yusuke Okamoto, Yokohama; Makoto Torakawa, Yokohama; Takashi Ikegame, Yokohama, all of Japan

[73] Assignees: Toko, Inc., Tokyo; Matsushita Electrical Industrial Co., Ltd., Osaka, both of Japan

[21] Appl. No.: 893,641

[22] Filed: Aug. 6, 1986

[30] Foreign Application Priority Data

| Aug. 7, 1985 | [JP] | Japan | 60-121056[U] |
| Jul. 9, 1986 | [JP] | Japan | 61-105358[U] |
| Jul. 14, 1986 | [JP] | Japan | 61-107779[U] |
| Jul. 14, 1986 | [JP] | Japan | 61-107780[U] |

[51] Int. Cl.$^4$ ............................................. H04B 1/10
[52] U.S. Cl. .................................... 455/301; 455/193; 455/300; 455/347; 455/349

[58] Field of Search ............... 455/193, 195, 300, 301, 455/347, 349; 334/15, 85

[56] References Cited

U.S. PATENT DOCUMENTS

| 3,643,168 | 2/1972 | Manicki | 455/300 |
| 3,723,882 | 3/1973 | Carlson | 455/301 |
| 3,783,420 | 1/1974 | Bastian | 455/301 |

*Primary Examiner*—Michael A. Masinick

[57] ABSTRACT

In a tuning circuit for AM receiver, tuning coils, oscillation coils and capacitance elements of an antenna tuning circuit, a radio frequency amplifier circuit, and a local oscillator circuit are accommodated in discrete shield casings for high frequency coils; and the discrete shield casings are disposed in a row and united with each other in the form of blocks, thereby eliminating the necessity to effect tracking adjustment.

10 Claims, 5 Drawing Sheets

TUNING CIRCUIT FOR AM RECEIVER

BACKGROUND OF THE INVENTION

1. Field of the Invention

This invention relates to a tuning circuit for AM receiver, wherein an antenna tuning circuit, a radio frequency amplifier circuit, and a local oscillator circuit are provided in the form of blocks each having a simplified construction using no trimmer capacitor, thereby facilitating non-adjustment of the AM receiver.

2. Description of the Prior Art

Generally, in an AM receiver of the superheterodyne type, a desired receiving frequency is selected at an antenna tuning circuit by adjusting a voltage applied to a variable-capacitance diode; the selected frequency signal is amplified in a semiconductor integrated circuit; and then the thus amplified signal is passed to a mixer circuit through a radio frequency amplifier circuit. Meanwhile, an oscillation frequency to be derived from a local oscillator circuit is automatically set by a PLL synthesizer; the oscillation frequency signal, along with the received frequency signal, is passed to the mixer circuit so that the received frequency signal is subjected to frequency-conversion; and a signal resulting from the frequency-conversion is passed to an intermediate frequency amplifier circuit.

In the conventional tuning circuit for AM receiver, an antenna tuning circuit, a radio frequency amplifier circuit, and a local oscillator circuit are individually provided on a printed circuit board. With such an arrangement, influences of stray capacitance and stray inductance are imparted to each stage through wiring patterns formed on the printed circuit board, so that the tuned frequency and/or oscillation frequency tends to be deviated from the theoretical design value. To eliminate such influences, it has been the practice to provide, at each stage, a trimmer capacitor and/or high frequency coil including a core for inductance adjustment; and by using such components for adjustment, tracking adjustment is performed to achieve a maximum receiving sensitivity in each receiving band. Obviously, however, the foregoing conventional arrangement is disadvantageous in that the number of components is increased and the number of assembling steps is also increased because of tracking adjustment.

Another disadvantage of the above-described conventional arrangement is such that because of the high frequency coils used in the tuning circuit being adjustable, it may happen, in use, that the cores of the coils are accidentally displaced due to vibration or the like so that a detuned state is likely to occur. Troublesomeness is also experienced in that a treatment such as paint locking of the inductance adjusting cores is usually required.

With the foregoing conventional arrangement, it is required that tracking adjustment be performed after all the components of the antenna tuning circuit, local oscillator circuit, intermediate frequency amplifier stage, low frequency amplifier stage and so forth have been mounted onto the printed circuit board. A further disadvantage is such that if a fault is detected as the consequence of the adjustment, then all of the components mounted on the printed circuit board must be discarded. Alternatively, the faulty component must be replaced with a new one, and then adjustment must be performed again. In either case, it is not economical.

SUMMARY OF THE INVENTION

It is an object of the present invention to provide a miniaturized tuning circuit for AM receiver, wherein an antenna tuning circuit and/or a radio frequency amplifier circuit, and a local oscillator circuit are provided in the form of blocks and united with each other, thereby eliminating the aforementioned disadvantages of the conventional arrangement.

Another object of the present invention is to provide a tuning circuit for AM receiver, wherein capacitance elements of the tuning circuit are accommodated in shield casings for high frequency coils, thereby facilitating non-adjustment of the receiver.

A further object of the present invention is to provide a tuning circuit for AM receiver, wherein means is provided for preventing distortion from being caused due to interference between high frequency coils incorporated in the respective blocks mentioned above.

To achieve the foregoing objects, according to an aspect of the present invention, there is provided a tuning circuit for AM receiver, wherein a tuning circuit and local oscillator circuit at the front end portion of the AM receiver are accommodated in shield casings for high frequency coils; the shield casings are disposed in a row and in the form of blocks (to be united with each other); and components included in each of the blocks are provided in proximity to an amplifier circuit and so forth.

According to another aspect of the present invention, there is provided a tuning circuit for AM receiver, wherein high frequency coils of an antenna tuning circuit, and high frequency coils of a local oscillator circuit are oriented in different directions so that ground conductors for the respective circuits can provided in such a manner as to extend in different directions, thereby preventing distortion from being caused due to interference between the antenna tuning circuit and the radio frequency amplifier circuit or local oscillator circuit.

Other objects, features and advantages of the present invention will become apparent from the ensuing description taken in conjunction with the accompanying drawings.

DESCRIPTION OF THE PREFERRED EMBODIMENTS

The tuning circuit for AM receiver according to the present invention is designed so that a desired receiving frequency can be automatically selected with the aid of a PLL synthesizer or the like, wherein tuning circuits and local oscillator circuit are accommodated in shield casings for high frequency coils at the front end portion of the AM receiver in such a manner as to form coil blocks.

Figure 1:
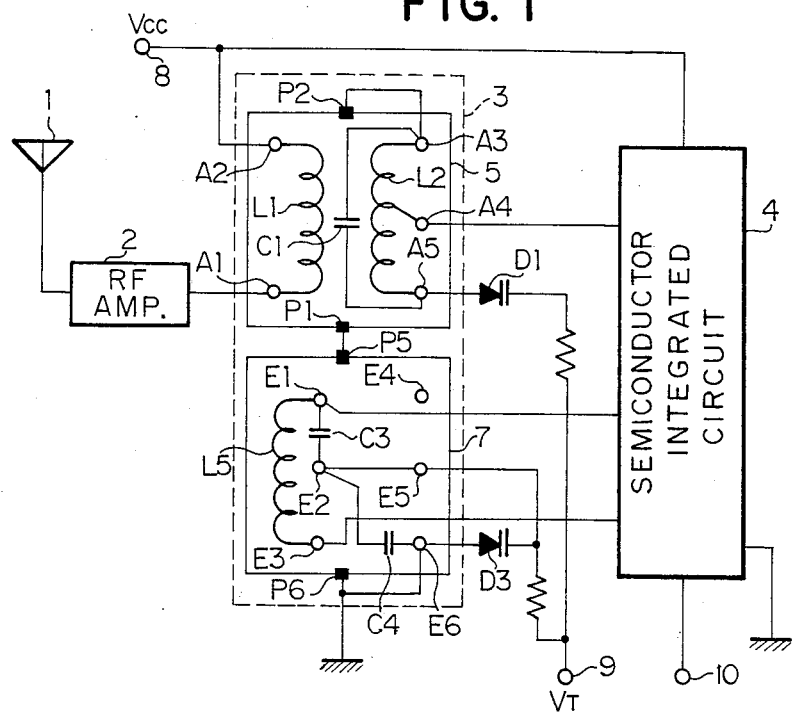
FIG. 1 shows the tuning circuit for AM receiver according to a first embodiment of the present invention, wherein the tuning circuit is constructed in the form of blocks.

Referring to FIG. 1, there is shown the tuning circuit for AM receiver according to an embodiment of the present invention, which includes a rod or loop antenna 1; a radio frequency amplifier circuit 2; and a casing 3 formed of a plastic material, metal or the like for integrating a shield casing 5 accommodating tuning coils L1 and L2 of an antenna tuning circuit and another shield casing 7 accommodating an oscillation coil L5 of a local oscillator circuit. The casing 3 may be omitted when the shields casings 5 and 7 are directly coupled to each other. The tuning circuit further includes a semiconductor integrated circuit 4 comprising amplifier circuits and mixer circuits provided in the form of an integrated circuit; a power supply terminal 8 to which a power source voltage $V_{cc}$ is applied; a terminal 9 to which is applied a tuning voltage $V_T$ for selecting a desired frequency; a terminal 10 at which a signal appears which in turn is supplied to an intermediate-frequency amplifier stage. A1–A5 and E1–E6 indicate terminal pins of radio frequency coils; P1, P2 and P5, P6 denote lug terminals provided at the ends of the shield casings 5 and 7, respectively; D1 and D3 indicate variable-capacitance diodes; C1 show a tuning capacitor connected in parallel with the tuning coil L2; C2 shows a padding capacitor; and C4 represents an oscillation capacitor.

A broadcast wave received by the antenna 1 is amplified in the radio frequency amplifier circuit 2 and then passed to the tuning circuit. Tuning voltage $V_t$, which are formed by a PLL synthesizer or the like, is applied from the terminal 9 to the tuning circuit and local oscillator circuit through the variable-capacitance diodes D1 and D3. The broadcast wave amplified in the radio frequency amplifier circuit 2 is passed through the coil L1 to the tuning circuit comprising the tuning coil L2, tuning capacitor C1 and variable-capacitance diode D1 so that a desired receiving frequency is selected, and then passed through the terminal pin A4 to the amplifier and thence to the mixer incorporated in the semiconductor integrated circuit 4. An oscillation frequency which is produced in the local oscillator circuit comprising the oscillation coil L5, padding capacitor C3, oscillation capacitor C4 and variable-capacitance diode D3, is passed through the terminal pin E1 to the mixer circuit incorporated in the semiconductor integrated circuit 4 so that the receiving frequency is converted to intermediate frequency and then passed to the intermediate frequency amplifier stage through the output terminal 10.

In the above-described arrangement of the present invention, the antenna tuning circuit and local oscillator circuit are accommodated in the shield casings 5 and 7, and these shield casings are disposed in close proximity with each other and accommodated in the casing 3 so that coil blocks are formed. More specifically, to the terminal pins A3 and A5 to which the tuning coil L2 of the antenna tuning circuit, the tuning capacitor C1 of the antenna tuning circuit is connected; to the terminal pins E1 and E2 for the radio frequency coil of the local oscillator circuit, the padding capacitor C3 is connected; and to the terminal pins E2 and E6, the oscillation coil C4 is coupled. The variable-capacitance diodes D1 and D3 are disposed in proximity with each other and mounted on a printed circuit board, and the anodes of these variable-capacitance diodes D1 and D3 are connected to the terminal pins A5 and E6 respectively. The terminal A3 is connected to the lug terminal P2, and the terminal pin E6 is coupled to the lug terminal P6, the lug terminals P1 and P5 being connected to and grounded through a ground conductor.

Figure 2:
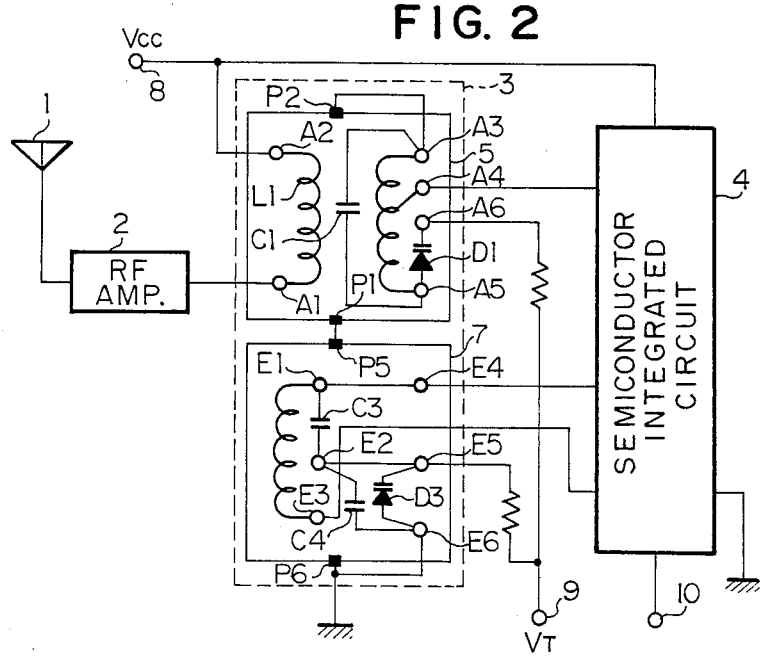
FIG. 2 shows the tuning circuit for AM receiver according to a second embodiment of the present invention, wherein the variable-capacitance diodes are accommodated in the blocks of FIG. 1.

Referring to FIG. 2, there is shown another embodiment of the present invention, which is similar to the embodiment of FIG. 2 except that the variable-capacitance diodes D1 and D3 are connected to the terminal pins A5, A6 and E5, E6 and accommodated in the shield casings 5 and 7, respectively.

As mentioned above, according to the present invention, the antenna tuning circuit and local oscillator circuit are formed in the shield casings for the radio frequency coils; thus, those circuits can be mounted on a printed circuit board in proximity to the integrated circuit device including the amplifier stage, and the respective components of each stage can be incorporated in the shield casings, so that stray capacitance and inductance can be minimized. Consequently, according to the present invention, it is possible to construct the tuning circuit of AM receiver with circuit constants that are close to theoretical design values, and thus it is possible to eliminate the necessity to provide a trimmer capacitor or high frequency coils including cores for inductance adjustment, for the purpose of effecting tracking error adjustment.

As known in the art, the configuration or receiving performance of antenna to be used with the tuning circuit of AM receiver, is modified depending on the type of the AM receiver, i.e., whether the receiver is one to be installed in a motor vehicle or portable one, for example. The manner in which the tuning circuit and local oscillator circuit are combined with each other, should be changed so as to be compatible with the modified configuration or receiving performance of the antenna.

Figure 3:
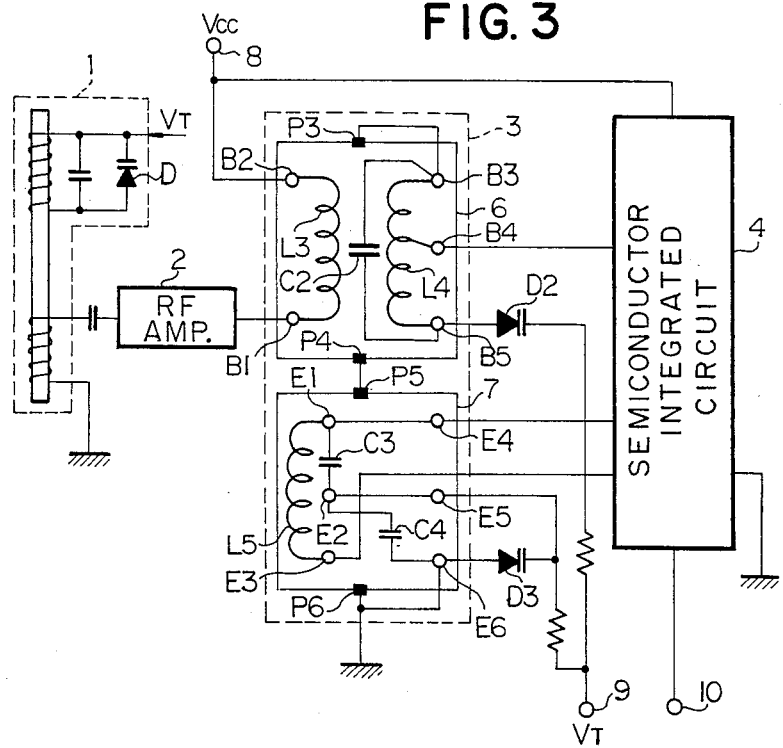
FIG. 3 shows the tuning circuit for AM receiver according to a third embodiment of the present invention, wherein coils of the tuning circuit are provided in the form of blocks.

Referring to FIG. 3, there is shown a third embodiment of the present invention using a bar antenna, wherein a first stage tuning circuit, i.e., antenna tuning circuit 1 is formed at the bar antenna portion; a second stage tuning circuit is provided in a shield casing 6; a tuning coil L3 is connected to terminal pins B1 and B2; and a tuning coil L4 and tuning capacitor C2 are connected to terminal pins B3 and B5. A center tap on the tuning coil L4 is connected to a terminal pin B4 and thence to a semiconductor integrated circuit 4 through conductor pattern formed on a printed circuit board. This embodiment includes a local oscillator circuit which is identical in connection with those shown in FIGS. 1 and 2.

Figure 4:
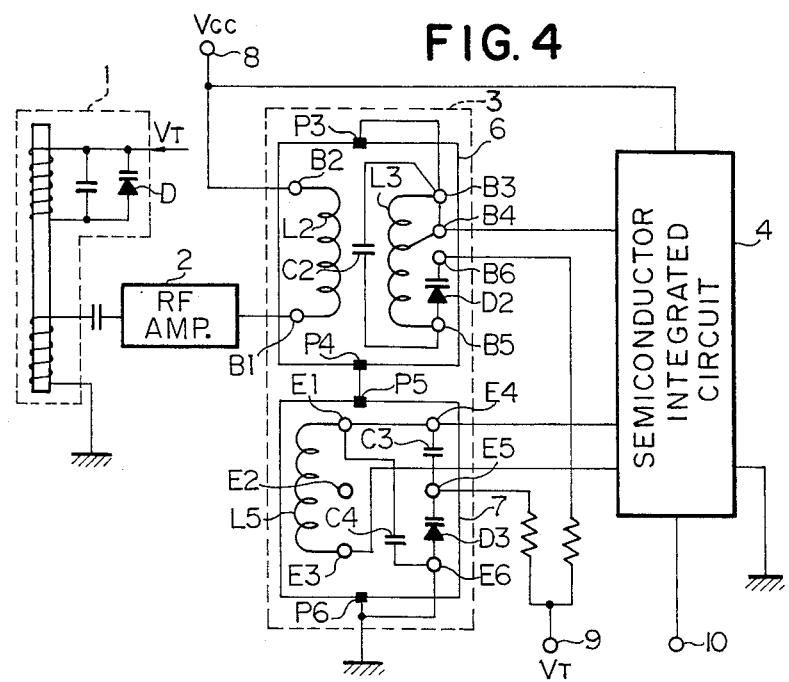
FIG. 4 shows a fourth embodiment of the present invention, wherein variable-capacitance elements are also accommodated in the coil blocks of FIG. 3.

FIG. 4 shows the tuning circuit for AM receiver according to a fourth embodiment of the present invention, which uses a bar antenna such as shown in FIG. 3 and in which variable-capacitance diodes D2 and D3 are accommodated in shield casings 6 and 7 respectively.

The embodiment of FIG. 4 includes a local oscillator circuit which is different in connection from those shown in FIGS. 1 and 3, and obviously it is also possible that the embodiments shown in FIGS. 1 and 3 may incorporate the same type of local oscillator as that of FIG. 4. In FIG. 4, a padding capacitor C3 is connected to terminal pins E4 and E5, and an oscillation capacitor C4 is coupled to terminal pins E1 and E6. Oscillation output is derived from the terminal pins E4.

Figure 5:
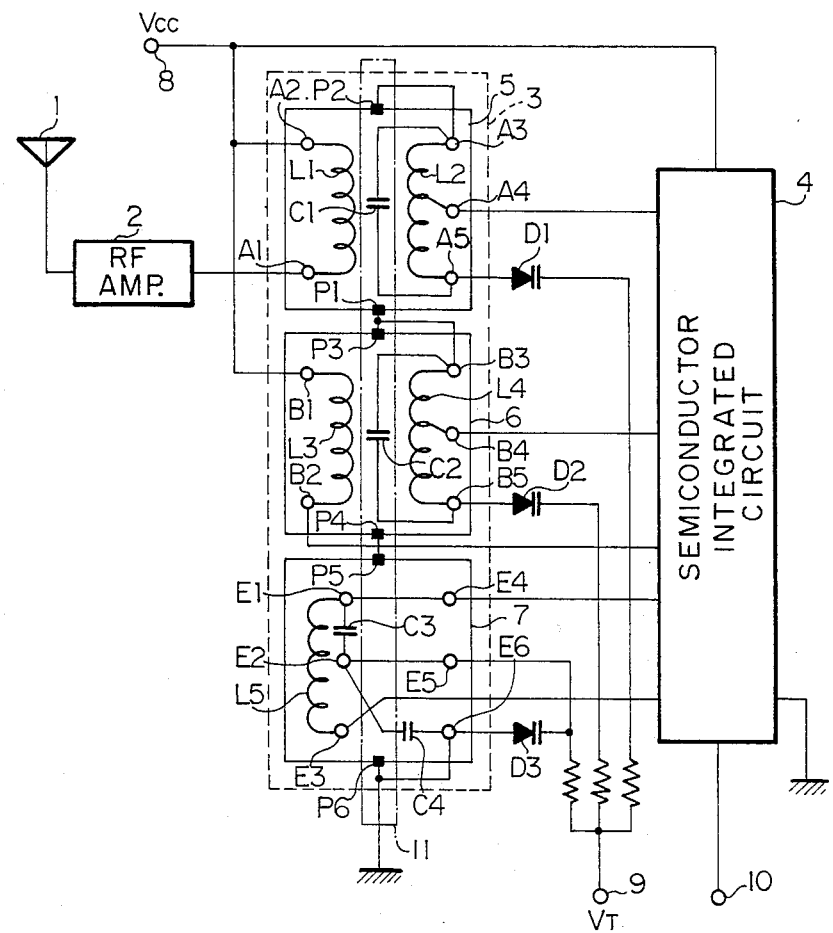
FIG. 5 shows the tuning circuit for AM receiver according to a fifth embodiment of the present invention, wherein high frequency coils of an antenna tuning circuit, radio frequency amplifier circuit, and a local oscillator circuit are provided in the form of coil blocks.

FIG. 5 shows a fifth embodiment of the present invention, which includes a double-stage tuning circuit arrangement to further improve the receiving performance of AM receiver, the respective tuning circuits being accommodated in shield casings 5 to 7 for high frequency coils at the front end portion of the AM receiver respectively. More specifically, the first stage antenna tuning circuit is accommodated in the shield casing 5, and the second stage tuning circuit of the radio frequency amplifier circuit is accommodated in the shield casing 6 to enhance the receiving performance of the receiver; and the local oscillator circuit is placed in the shield casing 7. In this way, coil blocks are provided. That is, according to this embodiment, the shield casing 6 accommodating the tuning circuit of the high frequency amplifier circuit is added to the embodiment of FIG. 1 so that the respective high frequency coils are united together by the casing 3. The shield casing 7 accommodating the local oscillator circuit is similar in construction to those of FIGS. 1 and 3. Lug terminals P1 to P6 are arranged in the same direction and soldered to and grounded through a ground conductor 11 provided on the printed circuit board.

As mentioned above, in the tuning circuit of AM receiver according to the embodiment of FIG. 5, the antenna tuning circuit, radio frequency amplifier and local oscillator circuit are accommodated in the shield casings for the high frequency coils and configured in the form of blocks. With such an arrangement, the respective circuits can be miniaturized, but due to the fact that the respective components are disposed in proximity to each other, it may happen that the components tend to interfere with each other through the ground conductor so that distortion tends to be caused, and it may also happen that magnetic flux occurring in one of the coils of the respective tuning circuits tends to leak to another of the coils and thus deteriorate the anti-oscillation and anti-disturbance characteristics of the receiver. Such situations can be coped with by such an arrangement as shown in FIG. 6.

Figure 6:
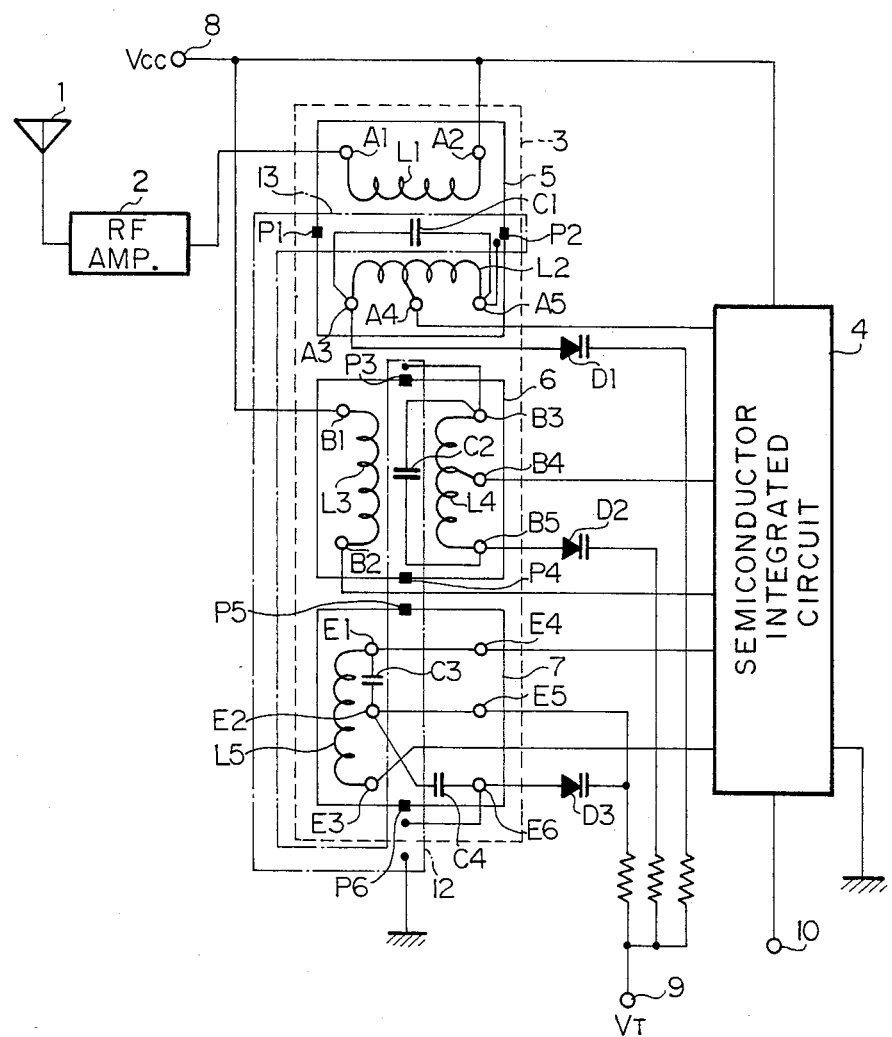
FIG. 6 shows a sixth embodiment of the present invention, wherein a ground conductor in the antenna tuning circuit of the embodiment shown in FIG. 5 is made to extend in a different direction from the direction in which a ground conductor in the other circuit extends.

The circuit arrangement of FIG. 6 is similar to that of FIG. 5, except that the position of the shield casing 5 for the antenna tuning circuit is changed through 90° from that shown in FIG. 5. Lug terminals P1 and P2 of the shield casing 5 are arranged in a direction changed through 90° from the direction in which lug terminals P3, P4, P5 and P6 of shield casings 6 and 7 are arranged. Ground conductor 12 to which the lug terminals P3 to P6 of the shield casings 6 and 7 are connected, extends in a different direction from that of ground conductor 13. These two conductors are grounded. The lug terminals P1 to P6 are soldered to the ground conductors 12 and 13.

According to this embodiment, by virtue of the fact that the lug terminals P1 and P2 of the shield casing 5 accommodating the tuning circuit of the antenna tuning circuit and the lug terminals P3 and P4 of the shield casing 6 accommodating the tuning circuit of the radio frequency amplifier circuit, are connected to the ground conductors 12 and 13 extending in different directions, it is possible to avoid interference between the two tuning circuits, thereby preventing occurrence of distortion. Furthermore, it is also possible to avoid interaction between magnetic fluxes by the fact the tuning coils L1 and L2 of the antenna tuning circuit are disposed in a direction changed through 90° from the direction in which the tuning coils L3 and L4 of the radio frequency amplifier circuit are disposed.

Figure 7:
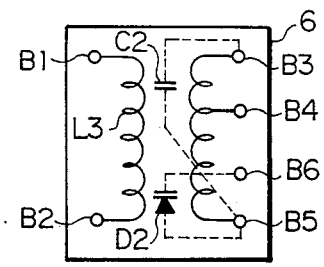
FIG. 7 shows a seventh embodiment of the present invention, wherein variable-capacitance diodes are accommodated in shield casings for high frequency coils.

Needless to say, the connection of the variable-capacitance diode D2 is by no means limited to the connection shown in FIGS. 5 and 6. It is possible that the variable-capacitance diode D2 may be connected between the terminal pins B3 and B6 in the shield casing 6, that the tuning capacitor C2 may be connected between the terminal pins B3 and B5, and that the diode D2 and capacitor C2 may be accommodated in the shield casing 6, as shown in FIG. 7. Furthermore, it is also possible that the variable-capacitance diode D1 may be disposed at the bottom or inner side face of the shield casing 6 for the antenna tuning circuit, and that the variable-capacitance diode D3 may be disposed at the bottom or inner side face of the shield casing 7 for the local oscillator circuit.

In the foregoing embodiments, the present invention has been applied in an electronic tuning circuit comprising a single tuning circuit. In the case of a double tuning circuit arrangement, too, by providing, under the coils, other components in accordance with the above-described concept, it is possible to reduce stray capacitance and stray inductance between respective circuits, thereby eliminating the necessity to effect tracking adjustment.

Figure 8:
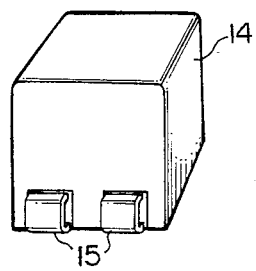
FIGS. 8 and 9 illustrate high frequency coils each provided with a surface-bondable type terminal.
Figure 9:
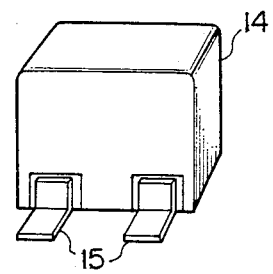

In each of the first to seventh embodiments described above, it is possible that the terminal pins of the high frequency coils may be terminals 15 which are surface-bonded to a lower portion of a shield casing 14 as shown in FIGS. 8 and 9.

As discussed above, the tuning circuit for AM receiver according to this invention can be greatly miniaturized by virtue of the fact that the tuning circuit and local oscillator circuit at the front end portion of the receiver are provided in the form of blocks so that the respective circuits can be disposed in close proximity to each other; and integrated circuit, etc. at the amplifier stage can be provided in proximity to the coils blocks. Furthermore, with the arrangement of this invention, by the fact that each circuit is accommodated in a shield casing, it is possible to reduce stray capacitance or stray inductance more greatly than in the prior art. According to the present invention, the front end portion of the AM receiver can be designed by using component constants determined on the basis of the theoretical design values; thus, by increasing the accuracy of the constants for the respective circuits, it is possible to construct a tuning circuit which represents less tracking error, i.e., requires substantially no tracking adjustment, without using any trimmer capacitor.

According to the present invention, a highly reliable tuning circuit for AM receiver is provided which may comprise fixed coils instead of high frequency coils for inductance adjustment, and which is free from the possibility that adjustment cores tend to be unintentionally displaced due to vibration or the like. No paint lock for cores is required so that the number of steps is reduced.

Furthermore, according to the present invention, the tuning circuit components can be mounted onto a printed circuit board without effecting tracking adjustment, and thus there is provided an AM receiver which requires no adjustment at the final step.

Still furthermore, according to the present invention, the respective circuits are accommodated in shield casings and thus less susceptible to interference, and by providing ground conductors in such a manner as to extend in different directions as mentioned earlier, it is possible to prevent distortion which would otherwise result from interference between the antenna tuning circuit and the tuning circuit of the radio frequency amplifier circuit which are provided in proximity to each other so as to be miniaturized. It is also possible to avoid influence of leakage flux between the two tuning circuits.

While the present invention has been illustrated and described with respect to specific embodiments thereof, it is to be understood that the invention is by no means limited thereto but encompasses all changes and modifications which will become possible within the scope of the appended claims.

We claim:

1. A tuning circuit for an AM receiver, comprising: an antenna tuning circuit having tuning coils and capacitance elements, a local oscillator circuit having an oscillation coil and capacitance elements, a first shield casing for high frequency coils, housing said tuning coils and capacitance elements of said antenna tuning circuit, a second shield casing for high frequency coils, housing said oscillation coil and capacitance elements of said local oscillator circuit, said first and second shield casings being disposed in a row in a common casing and united with each other, and terminal pins connecting said coils and capacitance elements housed in said casings for high frequency coils.

2. A tuning circuit for an AM receiver according to claim 1, wherein said capacitance elements of said antenna tuning circuit include a tuning capacitor connected to said tuning coils, and said capacitance elements of said local oscillator circuit include an oscillation capacitor and a padding capacitor, said oscillation capacitor and said padding capacitor being connected to said oscillation coil.

3. A tuning circuit for an AM receiver according to claim 2, wherein said capacitance elements of said antenna tuning circuit include a tuning capacitor and a variable-capacitance diode which are connected to said tuning coils, and said capacitance elements of said local oscillator circuit include an oscillation capacitor and a variable-capacitance diode which are connected to said oscillation coil.

4. A tuning circuit for an AM receiver comprising: an antenna tuning circuit, a radio frequency amplifier circuit having tuning coils and capacitance elements, and a local oscillator circuit having an oscillation coil and capacitance elements, a first shield casing for high frequency coils, housing said tuning coils and capacitance elements of said radio frequency amplifier, and a second shield casing for high frequency coils, housing said oscillation coil and capacitance elements of said local oscillator circuit, said first and second shield casings being disposed in a row in a common casing and united with each other, and terminal pins connecting said coils and capacitance elements housed in said shield casings for high frequency coils.

5. A tuning circuit for an AM receiver according to claim 4, wherein said capacitance elements of said radio frequency amplifier circuit include a tuning capacitor connected to said tuning coils thereof, and said capacitance elements of said local oscillator circuit include a padding capacitor and an oscillation capacitor, said oscillation capacitor and said padding capacitor being connected to said oscillation coil.

6. A tuning circuit for an AM receiver according to claim 4, wherein said capacitance elements of said radio frequency amplifier circuit include a tuning capacitor and a variable-capacitance diode which are connected to said tuning coils, and said capacitance elements of said local oscillator circuit include a padding capacitor, an oscillation capacitor, and a variable-capacitance diode, said padding capacitor, said oscillation capacitor and said variable-capacitance diode being connected to said oscillation coil.

7. A tuning circuit for an AM receiver, comprising: an antenna tuning circuit having tuning coils and capacitance elements, a radio frequency amplifier circuit having tuning coils and capacitance elements, and a local oscillator circuit having an oscillation coil and capacitance elements, a first shield casing for high frequency coils, housing said coils and capacitance elements of said antenna tuning circuit; a second shield casing for high frequency coils, housing said tuning coils and capacitance elements of said radio frequency amplifier circuit; and a third shield casing housing said oscillation coil and capacitance elements of said local oscillator circuit; said first, second and third shield casings being disposed in a row in a common casing and united with each other, and terminal pins connecting said coils and capacitance elements housed in said shield casings for high frequency coils.

8. A tuning circuit for an AM receiver according to claim 7, wherein said capacitance elements of said antenna tuning circuit include a tuning capacitor connected to said tuning coils thereof; said capacitance elements of said radio frequency amplifier circuit include a tuning capacitor connected to said tuning coils thereof; and said capacitance elements of said local oscillator circuit include a padding capacitor and an oscillation capacitor which are connected to said oscillation coil thereof.

9. A tuning circuit for an AM receiver according to claim 7, wherein said capacitance elements of said antenna tuning circuit include a tuning capacitor and a variable-capacitance diode which are connected to said tuning coils thereof; said capacitance elements of said radio frequency amplifier circuit include a tuning capacitor and a variable-capacitance diode which are connected to said tuning coils thereof; and said capacitance elements of said local oscillator circuit include a padding capacitor, an oscillation capacitor, and a variable-capacitance diode which are all connected to said oscillation coil thereof.

10. A tuning circuit for an AM receiver, comprising: an antenna tuning circuit having tuning coils and capacitance elements; a radio frequency amplifier circuit having tuning coils and capacitance elements; and a local oscillator circuit having an oscillation coil and capacitance elements; a first shield casing housing said tuning coils and capacitance elements of said antenna tuning circuit; a second shield casing housing said tuning coils and capacitance elements of said radio frequency amplifier circuit; and a third shield casing housing said oscillation coil and capacitance elements of said local oscillator circuit; said first, second and third shield casings being disposed in a row in a common casing in such a manner that coil blocks are formed; said first shield casing and said second shield casing having lug terminals soldered to different ground conductors provided on a printed circuit board, respectively.

* * * * *